US012740427B2

(12) United States Patent
Bouisse

(10) Patent No.: US 12,740,427 B2
(45) Date of Patent: Sep. 15, 2026

(54) RF AMPLIFIERS WITH IMPROVED STABILITY BY SOURCE INDUCTANCE ADJUSTMENT

(71) Applicant: MACOM Technology Solutions Holdings, Inc., Lowell, MA (US)

(72) Inventor: Gerard Bouisse, Saint Lys (FR)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 385 days.

(21) Appl. No.: 18/483,159

(22) Filed: Oct. 9, 2023

(65) Prior Publication Data

US 2024/0145414 A1 May 2, 2024

(30) Foreign Application Priority Data

Oct. 28, 2022 (EP) .................................... 22306636

(51) Int. Cl.

*H10W 44/20* (2026.01)
*H03F 1/56* (2006.01)
*H03F 3/195* (2006.01)
*H10W 70/60* (2026.01)
*H10W 70/63* (2026.01)

(Continued)

(52) U.S. Cl.

CPC ............ *H10W 44/20* (2026.01); *H03F 1/565* (2013.01); *H03F 3/195* (2013.01); *H10W 70/611* (2026.01); *H10W 70/635* (2026.01); *H10W 90/00* (2026.01); *H03F 2200/222* (2013.01); *H10W 44/234* (2026.01); *H10W 72/248* (2026.01); *H10W 72/252* (2026.01); *H10W 90/724* (2026.01)

(58) Field of Classification Search

None

See application file for complete search history.

(56) References Cited

U.S. PATENT DOCUMENTS 12,315,829 B2 * 5/2025 Rice ........................ H01P 3/081
2010/0033253 A1 2/2010 Narathong et al.

(Continued)

FOREIGN PATENT DOCUMENTS

EP 4343831 A1 * 3/2024 ......... H10D 62/8503
KR 20180059721 A 6/2018

(Continued)

OTHER PUBLICATIONS

Extended European Search Report corresponding to European Application No. 22306636.6 (12 pages) (May 8, 2023).

(Continued)

*Primary Examiner* — Michael Lebentritt
(74) *Attorney, Agent, or Firm* — Myers Bigel, P.A.

(57) ABSTRACT

A radio frequency transistor amplifier package includes a package substrate with input, output, and ground terminals, and a transistor die on the package substrate. The transistor die includes a semiconductor structure having a plurality of transistors and gate, drain, and source contacts electrically coupled thereto. An inductance adjustment element is electrically coupled between the source contacts and the ground terminal, and is configured to provide a stability factor K of greater than or equal to 1 for a first operating frequency range of the transistor die. Related devices and methods are also discussed.

25 Claims, 11 Drawing Sheets

(51) Int. Cl.
*H10W 72/20* (2026.01)
*H10W 90/00* (2026.01)

(56) References Cited

U.S. PATENT DOCUMENTS

2015/0364418 A1 12/2015 Leong et al.
2020/0365619 A1 11/2020 Lahbib et al.
2021/0313293 A1* 10/2021 Noori ...................... H03F 3/195
2021/0313935 A1* 10/2021 Noori .................... H01L 23/481
2024/0171137 A1* 5/2024 Lim ...................... H03F 1/0288

FOREIGN PATENT DOCUMENTS

WO WO-2021262920 A2 * 12/2021 ......... H10D 62/8503
WO WO-2022055776 A1 * 3/2022 ............. H01L 23/66
WO WO-2023034773 A1 * 3/2023 ........... H10D 64/254

OTHER PUBLICATIONS

Fong "High-frequency analysis of linearity improvement technique of common-emitter transconductance stage using a low-frequency-trap network" IEEE Journal of Solid-State Circuits 35(8):1249-1252 (Aug. 2000).

* cited by examiner

RF AMPLIFIERS WITH IMPROVED STABILITY BY SOURCE INDUCTANCE ADJUSTMENT

CROSS REFERENCE TO RELATED APPLICATIONS

The present application claims priority under 35 U.S.C. 119 to European Patent Application No. 22306636.6, filed Oct. 28, 2022, the disclosure of which is incorporated by reference herein in its entirety.

FIELD

The present disclosure relates to transistor devices, and more particularly, to transistor amplifier devices.

BACKGROUND

Electrical circuits requiring high power handling capability while operating at high frequencies, such as radio frequencies (500 MHz), S-band (3 GHz) and X-band (10 GHz), have in recent years become more prevalent. Because of the increase in high power, high frequency circuits, there has been a corresponding increase in demand for semiconductor devices which are capable of reliably operating at radio and microwave frequencies while still being capable of handling high power loads.

Radio Frequency (RF) power amplifiers in communication systems may be used for generating the high power needed for wireless communications. A power amplifier (PA) may include one or more active transistors and passive matching networks at the input and output nodes. Different RF power applications may have differing requirements for power amplifiers, for example, with respect to output power and efficiency. In general, a power amplifier operates at maximum power efficiency when the power amplifier transmits close to saturated power.

However, power efficiency tends to worsen as output power decreases. For example, RF PAs used in base stations may need to be efficient not only at peak power, but also at average power, which may be several decibels (dB) below peak power. Achieving this goal may be challenging because peak efficiency may be reached near peak power. At back-off or average power, the efficiency tends to drop drastically.

RF power amplifiers may also be desired to provide stable behavior (i.e., without oscillation independent of load) at the operating frequency range of the amplifier. However, instability issues (e.g., ringing, oscillations, parasitic feedback) may present challenges, particularly at RF operating frequencies.

SUMMARY

According to some embodiments of the present disclosure, a radio frequency (RF) transistor amplifier package includes a transistor die comprising a semiconductor structure including a plurality of transistors and gate, drain, and source contacts electrically coupled thereto; and an inductance adjustment element that is electrically coupled between the source contacts and an electrical ground member, and is configured to provide a stability factor K of greater than or equal to 1 for a first operating frequency range of the transistor die.

In some embodiments, a package substrate includes input, output, and ground terminals, and the transistor die is on the package substrate and the ground terminal is electrically coupled to the electrical ground member.

In some embodiments, the transistor die is mounted on a surface of the package substrate in a flip chip configuration with the source contacts adjacent the surface of the package substrate.

In some embodiments, the inductance adjustment element is configured to provide a predetermined inductance and is external to the transistor die.

In some embodiments, the inductance adjustment element includes at least one of: a plurality of conductive bumps or pillars; a dimension that is configured to separate the source contacts and the ground terminal by a predetermined distance; one or more conductive connection patterns in the package substrate having respective shapes and/or sizes; or a patterning of the electrical ground member.

In some embodiments, the predetermined inductance is free of inductance contributions from conductive vias that extend in the semiconductor structure of the transistor die.

In some embodiments, the transistor die includes a plurality of source fingers on the semiconductor structure, and is free of conductive vias that are electrically coupled to the source fingers.

In some embodiments, the inductance adjustment element is configured to provide an entirety of the predetermined inductance.

In some embodiments, a high pass impedance matching circuit is electrically coupled between the input terminal and the gate contact, and is configured to provide the stability factor K of greater than or equal to 1 for a second operating frequency range that is higher than the first operating frequency range.

In some embodiments, a low pass impedance matching circuit is electrically coupled between the input terminal and the gate contact, and is configured to provide the stability factor K of greater than or equal to 1 for a third operating frequency range that is lower than the first operating frequency range.

In some embodiments, the transistor die includes a plurality of gate fingers on the semiconductor structure, and a respective gate finger of the plurality of gate fingers has a unit gate width (UGW) that is based on the first operating frequency range.

In some embodiments, the semiconductor structure comprises gallium nitride and/or silicon carbide.

According to some embodiments, a method of fabricating a radio frequency (RF) transistor amplifier package includes providing a transistor die comprising a semiconductor structure including a plurality of transistors and gate, drain, and source contacts electrically coupled thereto; and providing an inductance adjustment element that is electrically coupled between the source contacts and an electrical ground member, and is configured to provide a stability factor K of greater than or equal to 1 for a first operating frequency range of the transistor die.

In some embodiments, the method further includes providing the transistor die on a package substrate comprising input, output, and ground terminals, where the ground terminal is electrically coupled to the electrical ground member.

In some embodiments, the method further includes mounting the transistor die on a surface of the package substrate in a flip chip configuration with the source contacts adjacent the surface of the package substrate.

In some embodiments, the inductance adjustment element is configured to provide a predetermined inductance and is external to the transistor die.

In some embodiments, providing the inductance adjustment element comprises at least one of: providing a plurality of conductive bumps or pillars; providing a dimension that is configured to separate the source contacts and the ground terminal by a predetermined distance; providing one or more conductive connection patterns in the package substrate having respective shapes and/or sizes; or providing a patterning of the electrical ground member.

In some embodiments, the predetermined inductance is free of inductance contributions from conductive vias that extend in the semiconductor structure of the transistor die.

In some embodiments, the transistor die comprises a plurality of source fingers on the semiconductor structure, and is free of conductive vias that are electrically coupled to the source fingers.

In some embodiments, the inductance adjustment element is configured to provide an entirety of the predetermined inductance.

In some embodiments, the method further includes providing a high pass impedance matching circuit that is electrically coupled between the input terminal and the gate contact, and is configured to provide the stability factor K of greater than or equal to 1 for a second operating frequency range that is higher than the first operating frequency range.

In some embodiments, the method further includes providing a low pass impedance matching circuit that is electrically coupled between the input terminal and the gate contact, and is configured to provide the stability factor K of greater than or equal to 1 for a third operating frequency range that is lower than the first operating frequency range.

In some embodiments, providing the transistor die comprises forming a plurality of gate fingers on the semiconductor structure, where a respective gate finger of the plurality of gate fingers has a unit gate width (UGW) that is based on the first operating frequency range.

In some embodiments, the semiconductor structure comprises gallium nitride and/or silicon carbide.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

The accompanying drawings, which are included to provide a further understanding of the invention and are incorporated in and constitute a part of this application, illustrate certain embodiment(s) of the disclosure. In the drawings.

DETAILED DESCRIPTION OF EMBODIMENTS

Figure 1A:
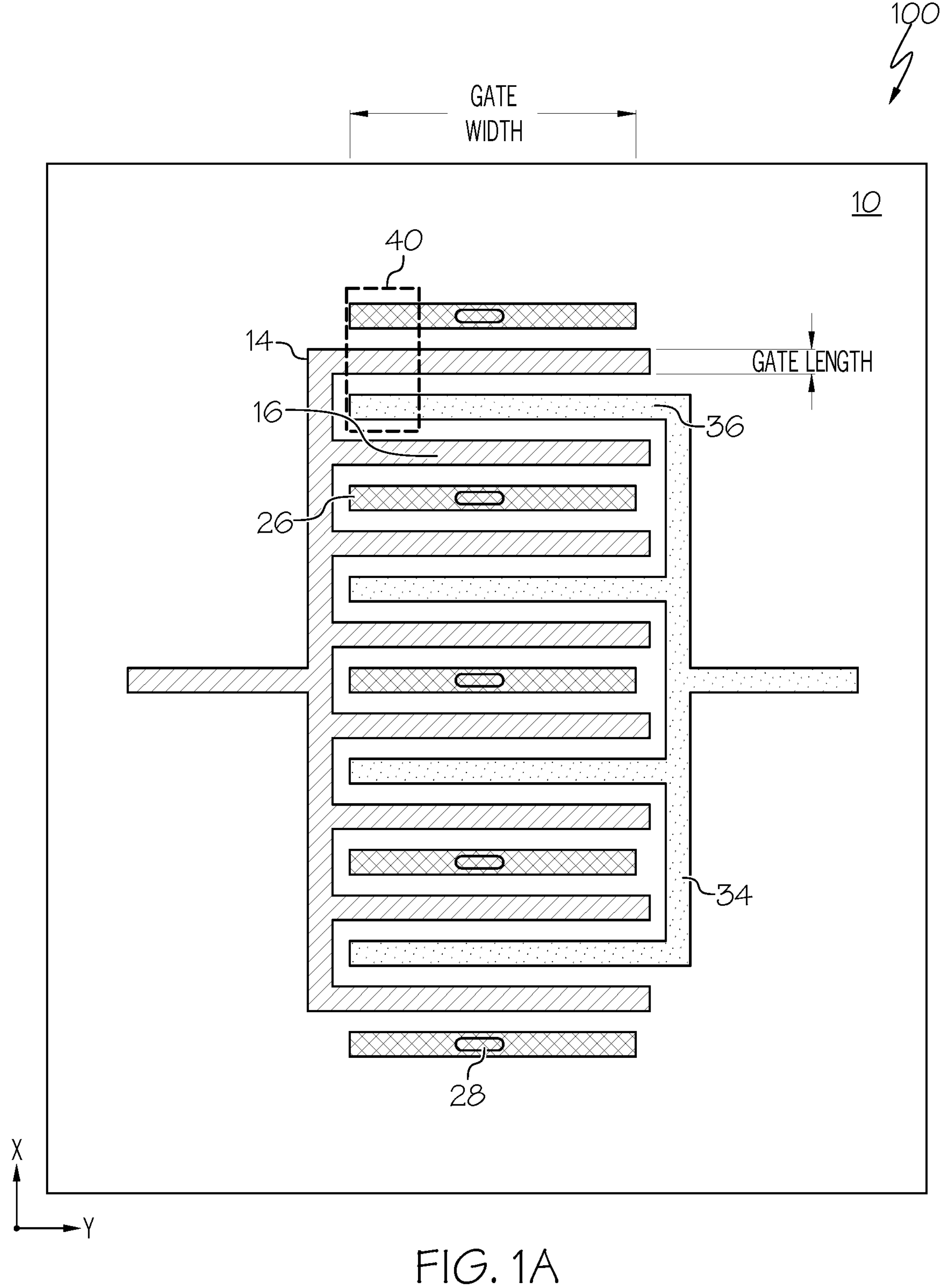
FIG. 1A is a plan view of a multi-cell transistor device.

Some power amplifier configurations described herein may be implemented using a plurality of "unit cell" transistors that are fabricated on a common semiconductor die, with a plurality of the unit cells defining each transistor amplifier device. Each unit cell transistor may include a source region, a drain region and a channel region in a semiconductor material, with the channel region being between the source and drain regions. A gate electrode or terminal (or "gate"), which may be implemented as one or more elongated gate fingers 16, is formed above the channel region and extends in parallel between elongated source fingers 26 and drain fingers 36, as is schematically illustrated in FIG. 1A. Embodiments of the present disclosure are not limited to any particular transistor type, and may include, for example, high electron mobility transistor (HEMT) embodiments or metal-oxide-semiconductor field effect transistor (MOSFET) embodiments, such as laterally diffused MOSFETs (LDMOS) embodiments.

Figure 1B:
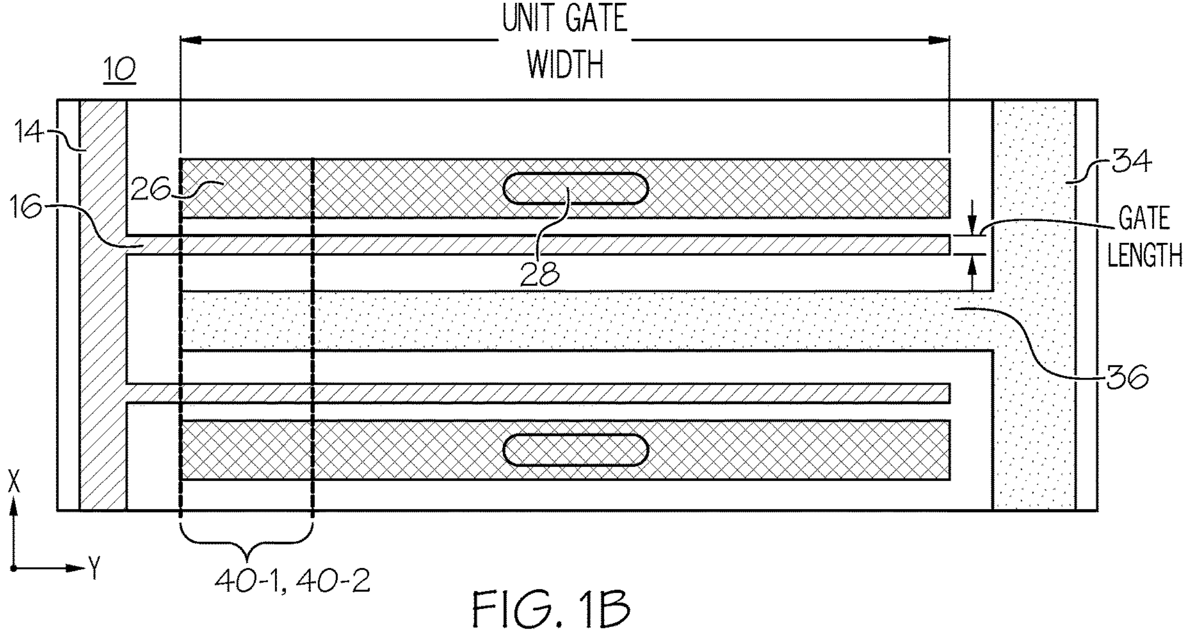
FIG. 1B is an enlarged plan view illustrating two gate fingers of FIG. 1A.

As shown in FIG. 1A, a unit cell transistor of a power amplifier semiconductor device (shown as transistor die 100) is illustrated at box 40, and includes an electrically conductive gate finger 16 that extends between adjacent source and drain fingers 26 and 36 on a semiconductor structure 10, such as a gallium nitride (GaN) and/or silicon carbide (SiC) semiconductor structure. The gate fingers 16 of respective unit cells 40 are spaced apart from each other along a first direction (e.g., the X-direction in FIG. 1A) and extend (e.g., in parallel) in a second direction (e.g., the Y-direction in FIG. 1A). FIG. 1B is an enlarged view of two gate fingers 16 of FIG. 1A that provide pairs of unit cell transistors 40-1, 40-2.

The gate fingers 16 are electrically connected to each other through a gate bus 14, which may be coupled to or may include at least one gate pad or gate contact (also referred to herein as a gate terminal) for external connection. Electrically conductive source fingers 26 are spaced apart from each other along the first direction and extend in the second direction. The source fingers 26 may be electrically connected to each other by through vias 28 that extend through the semiconductor structure 10 (also referred to herein as through semiconductor vias or TSVs 28). The TSVs 28 may be coupled to or may include at least one source pad or source contact (also referred to herein as a source terminal) for external connection. In some embodiments, the source fingers 26 may be electrically connected to the source pad or contact(s) (not visible in FIG. 1A) on the bottom side of the semiconductor structure 10, which may be coupled to an electrical ground. Electrically conductive drain fingers 36 are likewise spaced apart from each other along the first direction and extend in the second direction, and are electrically connected to each other through a drain bus 34, which may be coupled to or may include at least one drain pad or drain contact (also referred to herein as a drain terminal) for external connection.

The gate, source, and drain fingers 16, 26, 36 may each comprise a respective conductive material, such as a metal or a metal alloy. Each gate finger 16 extends along the Y-direction between a pair of adjacent source and drain fingers 26, 36. The "gate length" refers to the distance of the gate metallization 16 in the X-direction (between source and drain fingers 26 and 36). Some embodiments of the present disclosure may include a gate length of about 400 nanometers (nm) to about 150 nm or less, for example, about 100 nm or about 60 nm or less. The power handling capability of the semiconductor device 10 may be proportional to its "gate periphery." The gate periphery of semiconductor device 10 may refer the sum of the gate lengths for each gate finger 16.

The "gate width" is the distance by which the gate fingers 16 and the source and drain contacts 26 and 36 overlap in the Y-direction. That is, "width" of a gate finger 16 refers to the dimension of the gate finger 16 that extends in parallel to the adjacent source/drain contacts 26, 36 (the distance along the Y-direction). As shown in FIG. 1B, the "unit gate width" (UGW) may refer to the width of one gate finger 16. Some embodiments of the present disclosure may include gate fingers 16 having a UGW of about 500 micrometers (μm; also referred to as microns) or less. The total or overall gate width may refer to the sum of the gate widths of all of the gate fingers 16 of the semiconductor device 10. As such, devices with the same total gate width (e.g., 1000 microns) may be implemented using a smaller number of wider gate fingers 16 (e.g., two gate fingers 16 in parallel, each having a UGW of 500 microns, as shown in the example of FIG. 1B), or a greater number of narrower gate fingers 16 (e.g., ten gate fingers 16 in parallel, each having a UGW of 100 microns, which would provide a lower resistance). The total gate width of devices described herein may be denoted by the number of gate fingers times the UGW (e.g., a 10×100 μm device in the preceding example, or a 2×500 μm device in the example shown in FIG. 1B).

Several techniques may be used to provide operating stability for FET-based power amplifiers. Such techniques are briefly summarized below, with reference to instabilities linked to source and load impedances.

Figure 2A:
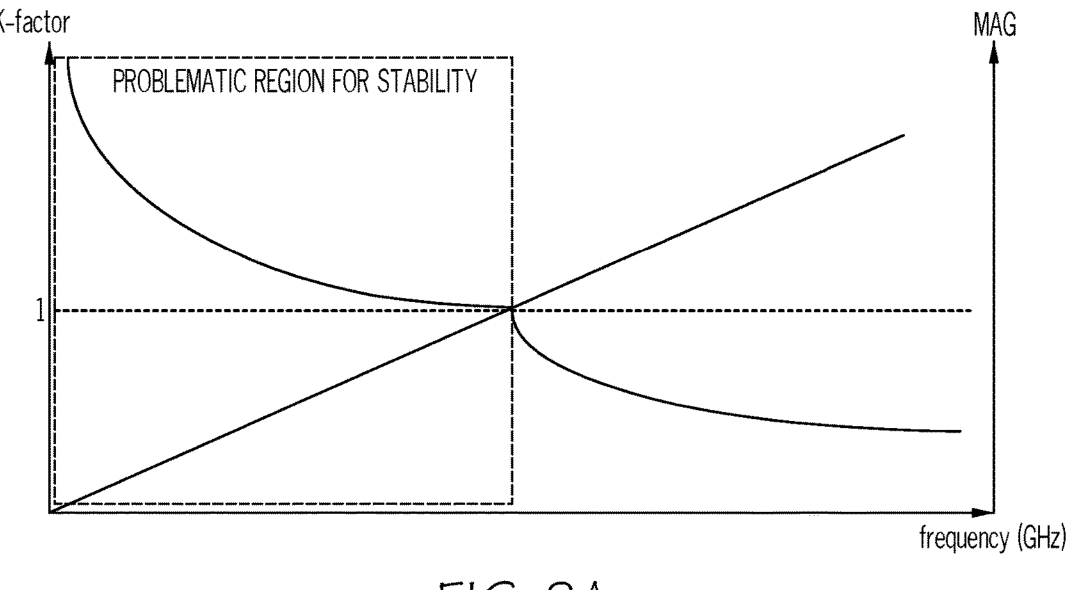
FIG. 2A is a graph illustrating relationships between stability and the maximum available gain of a power amplifier.

FIG. 2A is a graph illustrating the relationship between the stability (described with reference to a K-factor (also known as the Rollett factor) that is determined from S-parameters for a two-port network) and the maximum available gain (MAG) of a power amplifier. As shown in the graph of FIG. 2A, a power amplifier may provide stable behavior (i.e., without oscillation independent of load) for values of K≥1, a concept that may be referred to as unconditional stability. For values of K<1, stability may be conditional (i.e., depending on input and/or output conditions), particularly at lower frequencies (e.g., frequencies of 0 Hz to about 10 GHz or about 20 GHz for some wide bandgap power amplifiers). Various stability improvement techniques (some of which are described herein with reference to FIGS. 2C to 2H) may be used in monolithic microwave integrated circuits (MMIC) and/or discrete transistor packages to provide stability at a desired operating frequency range.

Figure 2B:
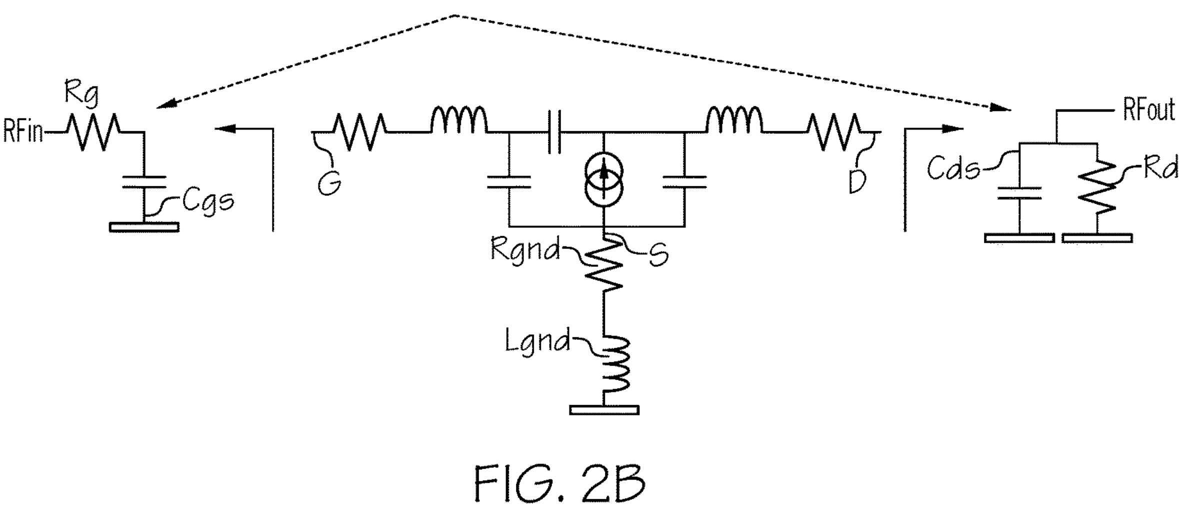
FIG. 2B is a schematic diagram illustrating circuit element models for input, output, and ground impedances for RF transistor amplifier packages configured for stability factor improvement according to some embodiments of the present disclosure.

FIG. 2B is a schematic diagram illustrating example circuit element models that may be used to determine contributions to stability, also referred to herein as a distributed modelling approach. In FIG. 2B, an input impedance as seen at the gate is shown as a series resistance and capacitance (RC) circuit, with a relatively low resistance Ri and a relatively high capacitance Cgs (and thus a high Q value). The output impedance seen at the drain is shown as a parallel RC circuit, with a relatively high resistance Rd and a relatively low capacitance Cds (and thus a low Q value). The output impedance may thus be relatively stable (e.g., with respect to risk of oscillation), while the input impedance may be more sensitive with respect to stability.

Embodiments of the present disclosure may arise from realization that input impedance (e.g., Rg, Cgs) and/or ground impedance (e.g., Rgnd, Lgnd) may have a greater effect on stability in comparison to output impedance (e.g., Rd, Cds). FIGS. 2C to 2H illustrate example circuit element models for input and/or ground impedances that may be implemented according to some embodiments of the present disclosure. In particular, as shown in FIGS. 2C to 2H, series resistance at the gate G (series Rg), parallel resistance at the gate G (Rgp), series resistance and capacitance between the gate G and drain D (series RC gate-to-drain; Rgd, Cgd), parallel resistance and capacitance (parallel RC; Rp, Cp) in series with the gate G, a (lossy) high pass input matching circuit (Cg, Lg) at the gate G, and inductance (Lgnd) at the source S are modelled as circuit elements to identify stability effects thereof.

Figure 2C:
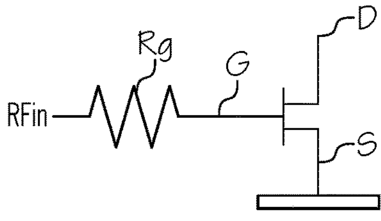
FIGS. 2C, 2D, 2E, 2F, 2G, and 2H illustrate example circuit element models for input impedances or ground impedances that may be implemented according to some embodiments of the present disclosure.

For the series Rg model shown in FIG. 2C, the K factor slope may increase proportionally as Rg is increased. Rg may thus be adjusted (in some embodiments, in combination with adjusting the UGW of respective gate fingers 16) to achieve stability (i.e., to provide a stability factor K of one or more) within an RF frequency range of interest. For example, a device including gate fingers 16 in a 2×360 μm configuration may achieve a K≥1 for frequencies of greater than about 6 GHz. Stability may be further improved (e.g., to provide K≥1 at frequencies greater than about 4 GHz) by increasing Rg (e.g., by including a series Rg of about 10 ohms). However, adjusting Rg may not improve low frequency stability, as it provides the resistance Rg in series with a high value impedance.

Figure 2F:
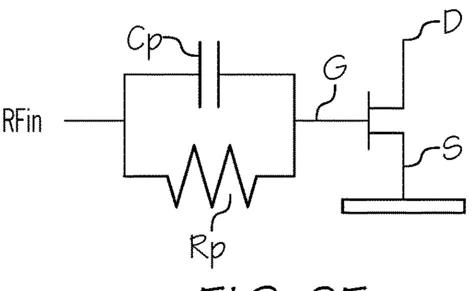
Figure 2F:
Figure 2D:
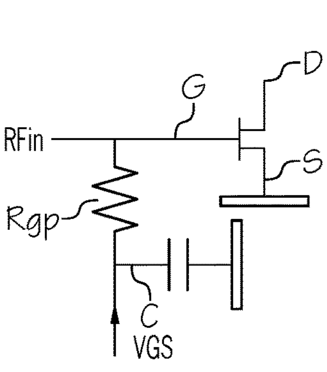

The parallel resistance at the gate model shown in FIG. 2D may provide an input impedance (Rgp, C) at low frequencies, which may absorb the input signal at low frequencies, thereby providing stability but limiting gain. As such, the Rgp model may not be applicable for linearization purposes in cellular applications at RF frequencies.

Figure 2G:
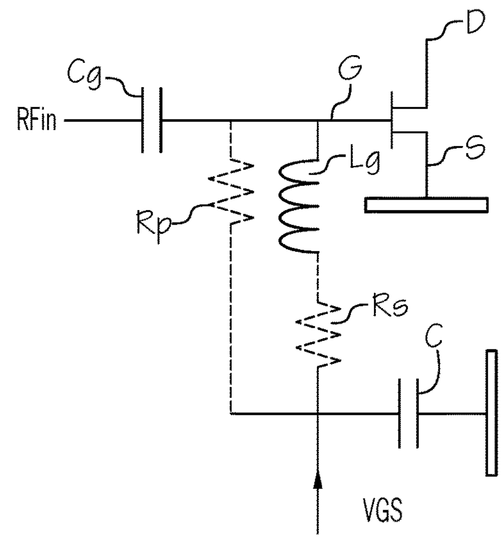
Figure 2E:
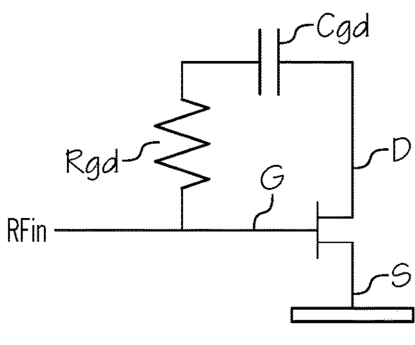

The series RC gate-to-drain model (Rgd, Cgd) shown in FIG. 2E may be complex in that, for power applications, the feedback network (from drain to gate) should not disturb large signal RF behavior, which may imply that the feedback resistance is significantly (e.g., about 100 times) larger than the current source impedance under large signal conditions. This model may provide a lossy feedback path at low frequencies, removing excessive low frequency gain. The series RC gate-to-drain model may generally be difficult to implement with wide bandgap semiconductor devices (such as GaN devices; with the exception of devices having low drain-to-gate capacitance) due to current source impedances, both small and large signal, and feedback capacitance.

For the parallel resistance and capacitance (Rp Cp) in series with the gate model shown in FIG. 2F, the input signal may be affected by the capacitance at high frequencies, while at low frequencies, the input signal is affected by the resistance. Thus, the parallel RC model may not be applicable for linearization purposes in cellular applications at RF frequencies.

FIG. 2G illustrates a high pass input matching circuit (Cg, Lg), which may reduce low frequency gain, but may be insufficient to affect stability without some losses (as a reactive only network may create a high Q resonator loading on the gate, leading to instability at resonance frequency). However, as shown in dashed lines, a "lossy" configuration of the high pass input matching circuit can reduce low frequency gain, as the resistance elements (shown as both series Rs and parallel Rp implementations) may damp the resonance. In particular, the parallel resistance Rp implementation may be used for cellular infrastructure (CIFR) applications for linearization purposes.

Figure 2H:
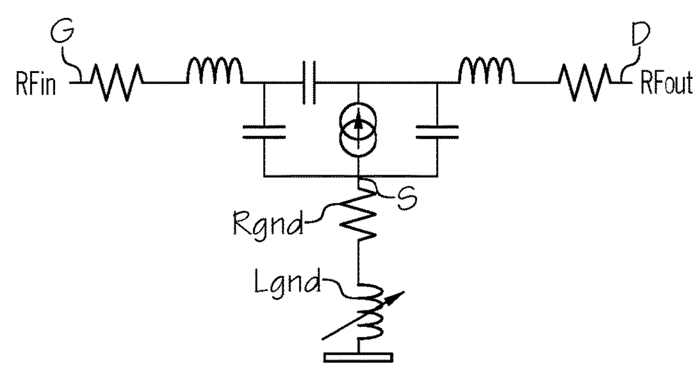

As shown in the model of FIG. 2H, the source impedance (Rgnd, Lgnd) can be used to tune the stability region in a broad manner. In particular, adjusting the value of the source inductance (illustrated as a variable inductor Lgnd) may modify the input impedance, reduce Q, and improve RF bandwidth with respect to gain.

However, in some conventional FET transistors (such as MMICs), adjusting the source inductance may be difficult or impossible. In particular, in some conventional configurations, the grounding of a power amplifier (e.g., at the source terminal of a transistor die) is implemented by through semiconductor vias that connect an electrical ground (e.g., a ground plane of a printed circuit board) to the source or other ground terminal of the power amplifier. The associated source inductance is thus a fixed value that is internal to the transistor die, which may typically be minimized (e.g., by reducing the thickness of the semiconductor structure and thus "length" of the through semiconductor via) for high frequency performance.

Also, while some conventional discrete packages may include a transistor die, interconnects to package leads, and one or more passive components (e.g., high Q reactive elements) for impedance prematch purposes, in many implementations (e.g., for GaN on SiC transistor dies) the passive components and the transistor die are not integrated on the same semiconductor structure. Rather, the passive components are typically connected to the transistor die using wirebonds and may include MOS (metal-oxide-semiconductor) or MIM (metal-insulator-metal) capacitors. Other resistive elements are typically not included in conventional discrete packages, making source inductance adjustment similarly difficult or impossible.

Such shortcomings of some conventional MMIC and discrete transistor packages may present issues with respect to stability. For example, while a customer may implement some of the input-side stabilization techniques using passive component matching circuits, the effectiveness of such solutions may be reduced due to the physical distance between the passive components and the transistor die. Other stabilization techniques may not be feasible for implementation. In particular, for power amplifiers including a discrete transistor package with PCB-based matching and SMD components (e.g., capacitors and resistors), the inductance at the source terminal may not be adjusted, as noted above.

Embodiments described herein may provide configurations that can achieve values of K greater than or equal to 1 (and thus, improved stability) over a wider operating frequency range (also referred to as a broader RF bandwidth) than illustrated in FIG. 2A, for example, at desired operating frequency ranges of less than 20 GHz, or less than 10 GHz. In some embodiments, this stability improvement may be achieved at frequencies both above and below the desired operating frequency range. As such, a stability factor K of greater than or equal to 1 may be achieved over a broad range of lower frequencies, for example, from about 500 MHz to about 20 GHz, about 1 GHz to about 15 GHz, from about 2 GHz to about 10 GHz, or from about 4 GHz to about 8 GHz.

In particular, some embodiments of the present disclosure may arise from realization that some attachment configurations may allow for variability or tuning of the source inductance (e.g., at the source terminal or source contacts of a transistor die) so as to stabilize transistor operation over a desired and broad RF bandwidth, alone or in combination with one or more other stabilization techniques described herein. For example, a flip chip transistor configuration may allow the inductance provided by the electrical connection between the source and the ground (which can be entirely outside of the transistor die) to be tuned in order to provide stabilization over a desired operating frequency range, free of inductances from internal through semiconductor vias or effects of other inductances internal to the transistor die. Source inductance adjustment as described herein may thus use an unstable active device technology to implement PAs that can be configured for operation in any RF band of interest, with the flip chip configuration providing an example embodiment for implementing source inductance adjustment.

Embodiments of the present disclosure are thus directed to packaged transistor amplifier configurations including a package substrate (e.g., a PCB) and at least one transistor die mounted on the package substrate (e.g., in a flip chip configuration), where source terminal or source contacts of the transistor die is/are coupled to an electrical ground member. A source inductance may be provided by an impedance adjustment element (referred to herein more specifically as an inductance adjustment element) that is electrically coupled between the source terminal and the electrical ground member. The inductance adjustment element may include, but is not limited to, conductive bumps or pillars; element(s) configured to separate the source terminal from the ground member by a predetermined distance; conductive vias or other conductive connection patterns in the package substrate; and/or the electrical ground member itself.

In some embodiments, inductance adjustment element may be configured to provide a desired source inductance by selecting and/or optimizing one or more of the collective inductance provided by the conductive bumps or pillars between the source terminal and the electrical ground, the distance between the source terminal and the electrical ground member (e.g., the PCB ground plane), the shapes of conductive vias in the substrate or PCB, and/or the shapes of conductive patterns providing the electrical ground member (e.g., the PCB ground plane patterning). As such, some embodiments of the present disclosure provide inductance adjustment elements of various configurations that can be used to tailor or tune a ground source inductance to stabilize an RF transistor amplifier, in some instances with the transistor die in a flip chip configuration.

In contrast, in some conventional RF power devices, the source of the device is typically grounded using through semiconductor vias (e.g., through SiC vias for a silicon carbide transistor die), which provide a fixed source inductance. While the thickness of the semiconductor structure can be reduced for thermal considerations and/or to minimize the source inductance presented by the through semiconductor vias for higher frequency operation, the fixed inductance of the through semiconductor vias in such conventional devices may provide little to no freedom to adjust stability versus frequency by altering the source inductance as achieved by embodiments of the present disclosure.

Embodiments of the present disclosure are described below with reference to RF transistor amplifier packages or power amplifiers (PAs) 400, 500, 600 that include one or more transistor dies 300 on a substrate 260. The transistor die(s) 300 may be formed (e.g., by epitaxial growth and other semiconductor processing and metallization steps) or otherwise provided on a semiconductor structure 10, 310. For example, the semiconductor structure 10, 310 may include Group III-nitride based materials (such as gallium nitride (GaN)) and/or silicon carbide (SiC). Other materials for the semiconductor structure 10, 310 may include, but are not limited to sapphire, diamond, aluminum nitride, aluminum gallium nitride, gallium nitride, silicon, GaAs, LGO, ZnO, LAO, InP, and the like.

The substrate 260 may be a single- or multi-layer laminate, such as a single- or multi-layer printed circuit board (PCB). The substrate 260 includes conductive wiring or connection patterns 262 (e.g., traces 262", vias 262', interlayer wiring, etc.) extending therein or thereon. The substrate 260 may provide a structural element or base on which the semiconductor structure 10, 310 is attached or mounted in a transistor amplifier package 400, 500, 600.

In the following examples, the transistor die(s) 300 are illustrated as being mounted on the substrate 10 in a flip chip configuration, in which one or more terminals of the one or more transistor dies 300 are coupled to a substrate 260 (which may include one or more matching circuits) by one or more conductive bumps or pillars 301. However, it will be understood that embodiments of the present disclosure are not limited to transistor dies 300 mounted in flip chip configurations, and may include any configurations with inductance adjustment element(s) that electrically couple the source terminal(s) of the transistor die(s) 300 to an electrical ground plane to provide a stability factor K of greater than or equal to 1 for a desired operating frequency range as described herein.

Figure 3A:
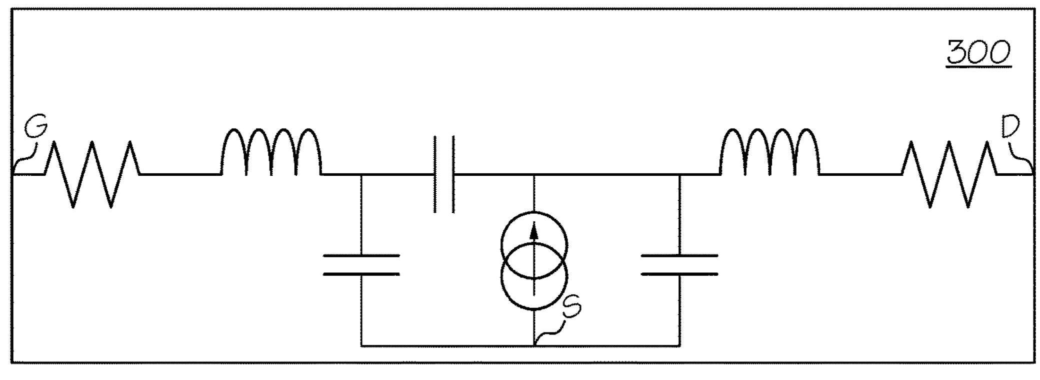
FIG. 3A is a circuit element model and FIG. 3B is a plan view illustrating example transistor dies configured for operation at a desired frequency range with stability factor improvement according to some embodiments of the present disclosure.
Figure 3B:
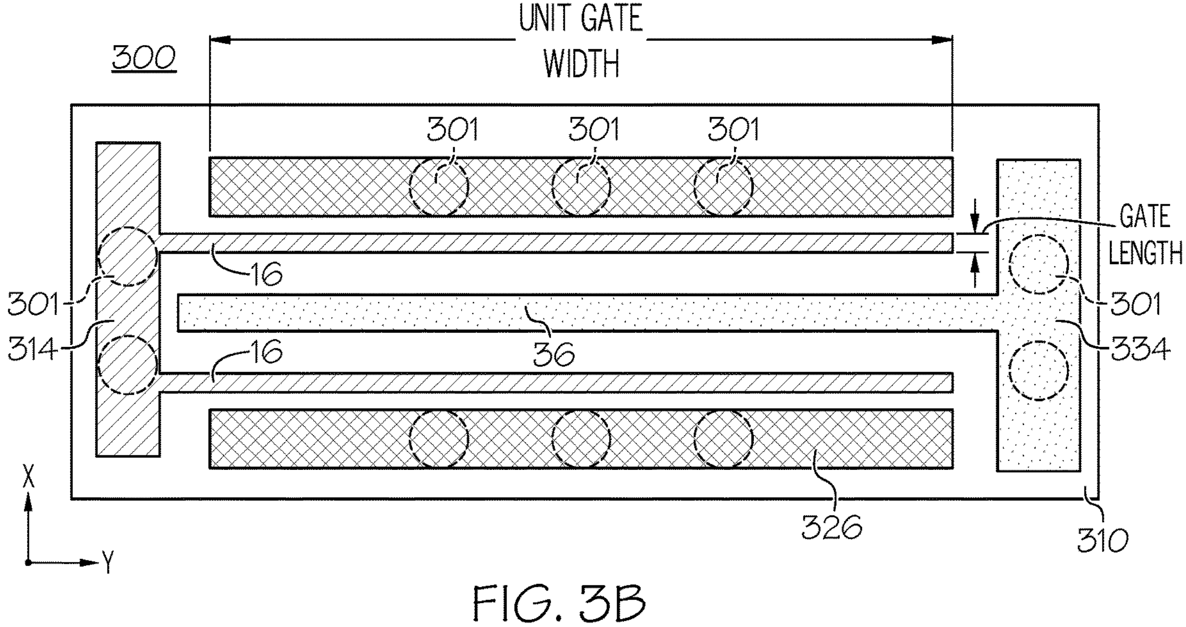

FIG. 3A is a circuit element model and FIG. 3B is a plan view illustrating an example transistor die 300 configured for stability factor improvement with source impedance and operating frequency adjustment according to some embodiments of the present disclosure. In the plan view of FIG. 3B, the semiconductor structure 310 is shown as transparent to illustrate the respective components (i.e., the gate contact 314, the source contacts 326, and the drain contact 334) that provide the gate G, source S, and drain D of the transistor die 300 and the conductive bumps (or pillars) 301 that can be used to electrically connect the contacts 314, 326, 334 to a package substrate.

As shown in FIG. 3B, the gate contact 314 is electrically connected to a plurality of gate fingers 16 on the transistor die 300. The transistor die 300 can be configured for operation in a desired frequency range based on a unit gate width (UGW) of a respective gate finger 16. For example, the unit gate width UGW and/or number of gate fingers (NGF) may be scaled based on (i.e., to "match") a desired operating frequency range. As noted above, a same total gate width may be implemented using a greater number of narrower gate fingers 16 or a comparatively fewer number of wider gate fingers 16. However, in some embodiments, a higher stable gain can be obtained with a comparatively fewer number of wider gate fingers 16 (shown as "longer" in the Y-direction, which may refer to a UGW leading to K factor of approximately or greater than 1), rather than a greater number of shorter fingers 16.

That is, while a greater number of narrower gate fingers 16 (e.g., ten narrower gate fingers 16 in parallel) may provide a lower resistance, some embodiments of the present disclosure may utilize a comparatively fewer number of wider gate fingers 16 (e.g., two wider gate fingers 16 in parallel, as shown in the example of FIG. 3B), to achieve improved stability. For example, embodiments of the present disclosure may include a UGW of about 500 μm or less, e.g., about 300 to about 400 microns, about 200 to 300 microns, or about 100 to 200 microns, depending on the operating frequency range. Accordingly, the UGW for a respective gate finger 16 can be configured based on the desired operating frequency range, where, in general, the lower the operating frequency range, the larger the UGW. For example, some embodiments may include gate fingers 16 having a UGW configured for an operating frequency range of about 500 MHz to about 20 GHz, about 1 GHz to about 15 GHz, about 2 GHz to about 10 GHz, or about 4 GHz to about 6 or 8 GHz. More generally, the UGW (and the number of fingers for a given power level) may be selected to improve stability for a given operating frequency range.

Figure 4A:
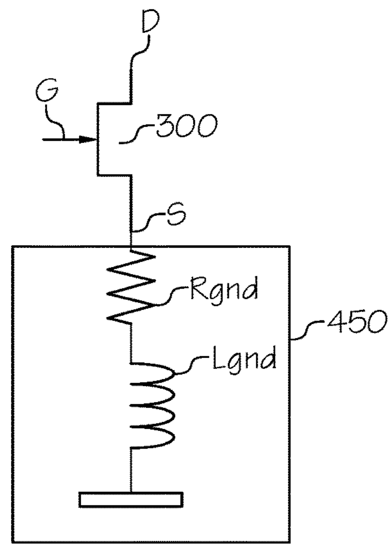
FIG. 4A is a circuit element model and FIG. 4B is a side view illustrating example transistor amplifier packages configured for stability factor improvement with inductance adjustment elements according to some embodiments of the present disclosure.
Figure 4B:
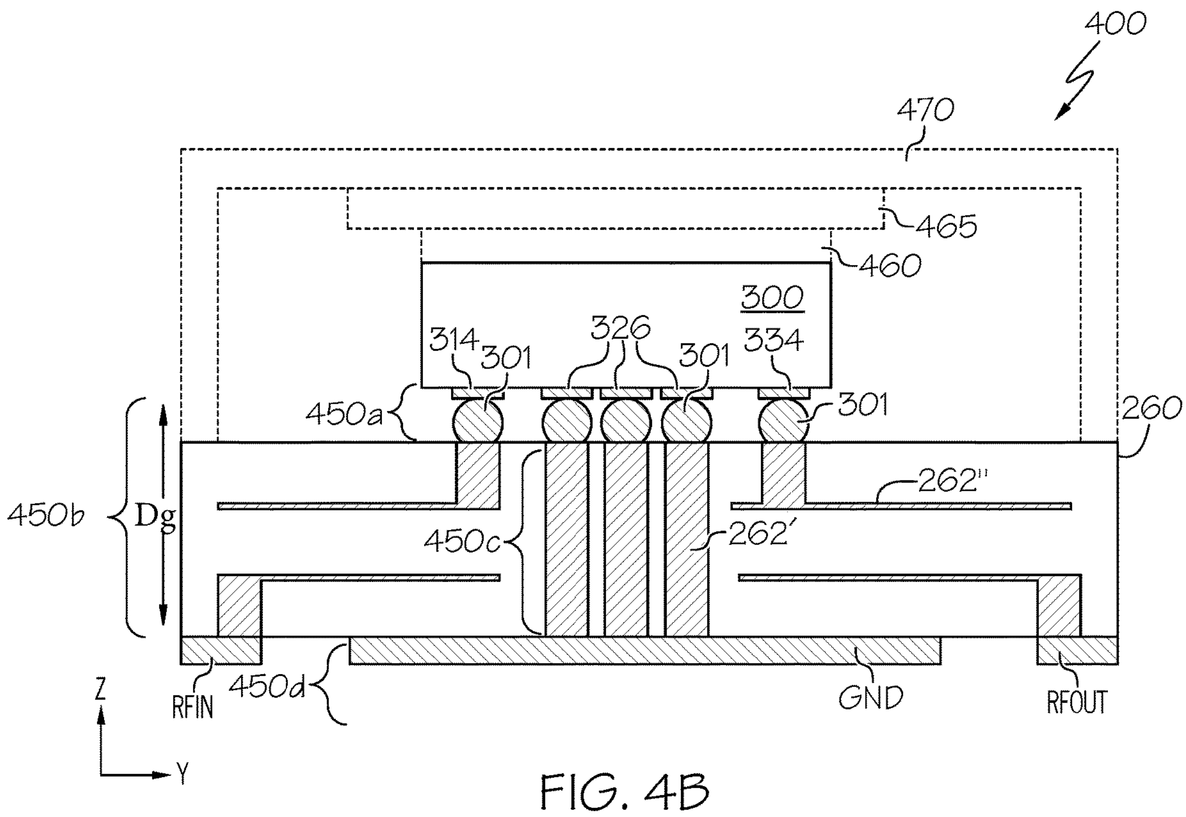

FIG. 4A is a circuit element model and FIG. 4B is a side view illustrating example transistor amplifier packages 400 configured for stability factor improvement with inductance adjustment elements according to some embodiments of the present disclosure.

As shown in FIGS. 4A and 4B, the source terminal of the transistor die 300 is electrically coupled to an electrical ground member **450*d* by an inductance adjustment element 450 (represented by a series resistance Rgnd and inductance Lgnd in the circuit model of FIG. 4**A).

FIG. 4B illustrates an example RF transistor amplifier package 400 that implements the circuit model of FIG. 4A. The RF transistor amplifier package 400 includes a package substrate 260 and a transistor die 300 on the package substrate 260. In the example package 400 of FIG. 4B, the transistor die 300 is mounted on a package substrate 260 in a flip chip configuration, with the active region of the die 300 adjacent the surface of package substrate 260. The package substrate 260 further includes the input terminal RFin and output terminal RFout on a surface thereof.

The package substrate 260 may be a multi-layer laminate (such as a PCB) that includes conductive layer patterns 262" and/or conductive vias 262' (collectively referred to as conductive connection patterns 262) that are electrically connected to respective terminals 314, 326, 334 of the transistor die(s) 300 by conductive bumps or pillars 301. The multi-layer laminate 260 and conductive connection patterns 262 may be fabricated using semiconductor processing techniques by depositing conductive and insulating layers and/or patterns on a base material and by forming vias and conductive routing patterns within the structure. The conductive connection patterns 262 also couple the terminals 314, 326, 334 of the transistor die(s) 300 to input RFin, output RFout, and ground GND terminals of the package 400. In some embodiments, the conductive connection patterns 262 and related structures in the multi-layer laminate 260 may be configured to provide distributed circuit elements that implement passive components of matching circuits coupled between the input terminal RFin and the gate contact 314, and/or between the drain contact 334 and the output terminal RFout.

Still referring to FIGS. 4A and 4B, inductance adjustment element 450 electrically couples the source contacts 326 to the ground terminal GND. In the example package 400 of FIG. 4B, the inductance adjustment element 450 is implemented by a combination of conductive bumps or pillars 301, a separation or distance Dg between the source contacts 326 and the electrical ground member 450*d* (in this example, provided largely by a thickness of the package substrate 260), and respective shapes 450*c* of one or more of the conductive connection patterns (e.g., conductive vias 262') in the package substrate 260. In further embodiments, the inductance adjustment element 450 may be implemented by pattering the electrical ground member 450*d* (e.g., to include one or more inductors, such as spiral inductors). While FIG. 4B illustrates multiple example components of inductance adjustment elements 450 as described herein in combination, it will be understood that the components may be implemented alone or in any combination to provide a desired or predetermined inductance value between the source contacts 326 and the ground terminal GND so as to achieve a stability factor K of about 1 or more.

In the example of FIG. 4B, the transistor die 300 is free of through semiconductor vias such as the TSVs 28 of FIG. 1B) in the semiconductor structure 310 that electrically connect the source fingers 26 to the ground terminal GND. For example, the transistor die 300 may include a SiC-based semiconductor structure 310, but the transistor die 300 may be free of through SiC vias. The inductance provided by the inductance adjustment element 450 is thus free of inductance contributions from through semiconductor vias in the semiconductor structure 310 of the transistor die 300. As such, the inductance between the source contacts 326 and the ground member GND is entirely provided by the inductance adjustment element 450, which is completely external to the transistor die 300.

Accordingly, based on the desired operating frequency range of the transistor amplifier package 400, one or more transistor die(s) 300 may be provided with respective gate fingers 16 having a unit gate width (UGW) that is selected or otherwise configured based on the desired operation frequency range, and the inductance adjustment element 450 may include one or more components (e.g., the conductive bumps/pillars 301, ground plane distance Dg, the conductive vias 262' in the package substrate 260, and/or the patterning 450*d* of the ground plane GND) configured to provide a stability factor K of greater than or equal to 1 for the desired operating frequency range of the transistor die(s) 300. For example, some embodiments may include inductance adjustment elements 450 configured to provide K≥1 for an operating frequency range of about 2 GHz to about 10 GHz, or about 4 GHz to about 6 GHz.

The example transistor amplifier package 400 may also include one or more heat dissipating elements 460, 465. In the example of FIG. 4B, the surface of the semiconductor structure 10, 310 opposite to the package substrate 260 includes a thermal interface material (TIM) 460 thereon. The TIM 460 may be configured to transfer heat generated from the semiconductor structure 10, 310 to a heat sink (shown as heat spreader 465 in FIG. 4B). The TIM 460 may be electrically and thermally conducting, or thermally conducting but electrically insulating, and may define a thermal conduction path configured to dissipate heat from the "top" of the package 400. A protective member 470 (e.g., a lid or encapsulant) may also be provided on or covering the die 300 and/or other components of the package 400. The protective member 470 may be formed of a thermally conductive material and/or may include an opening therein to expose the heat sink 465 in some embodiments. However it will be understood that the TIM 460, heat spreader 465, and/or protective member 470 may not be present in some embodiments.

Figure 5A:
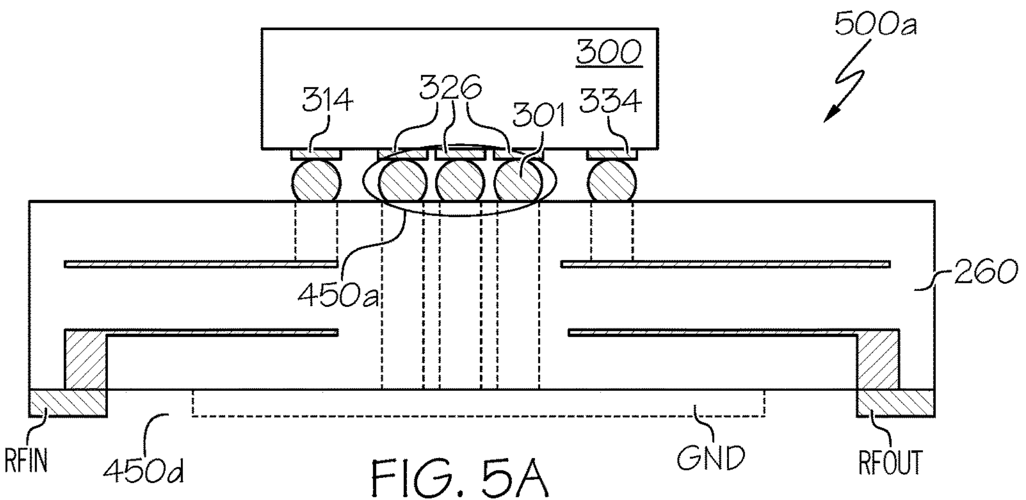
FIGS. 5A, 5B, 5C, and 5D are side views
Figure 5B:
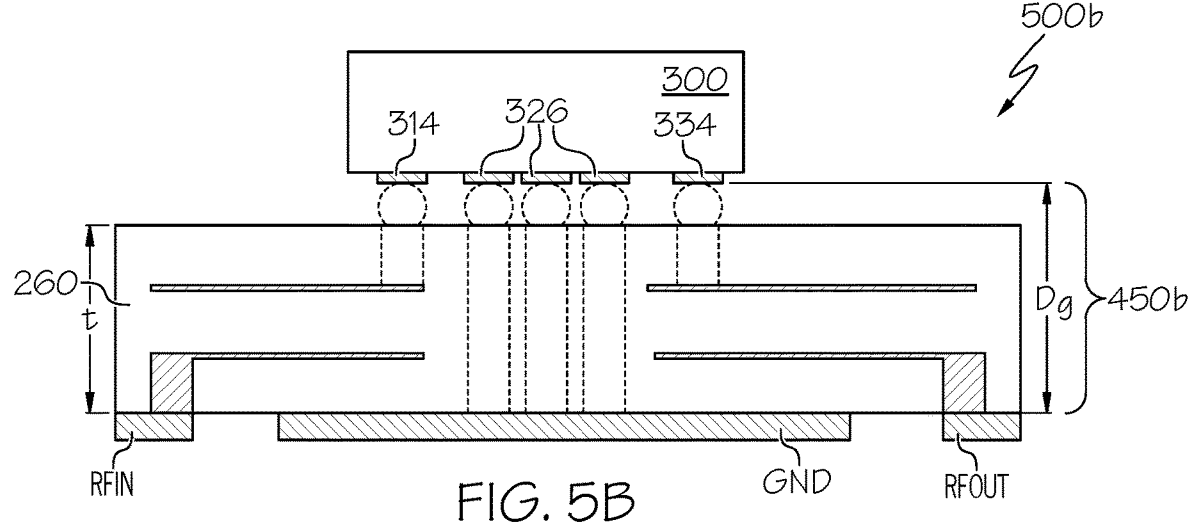
Figure 5C:
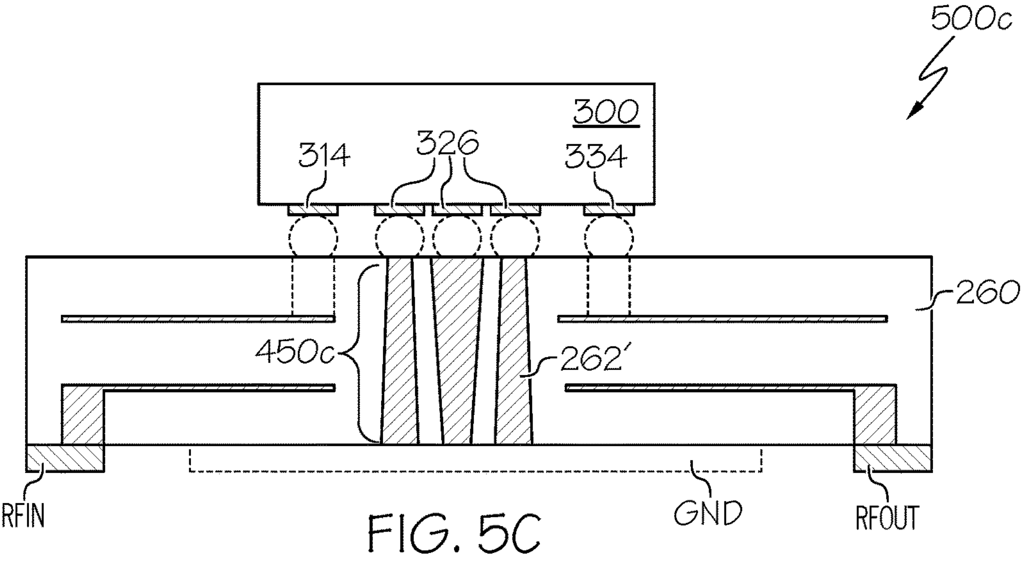
Figure 5D:
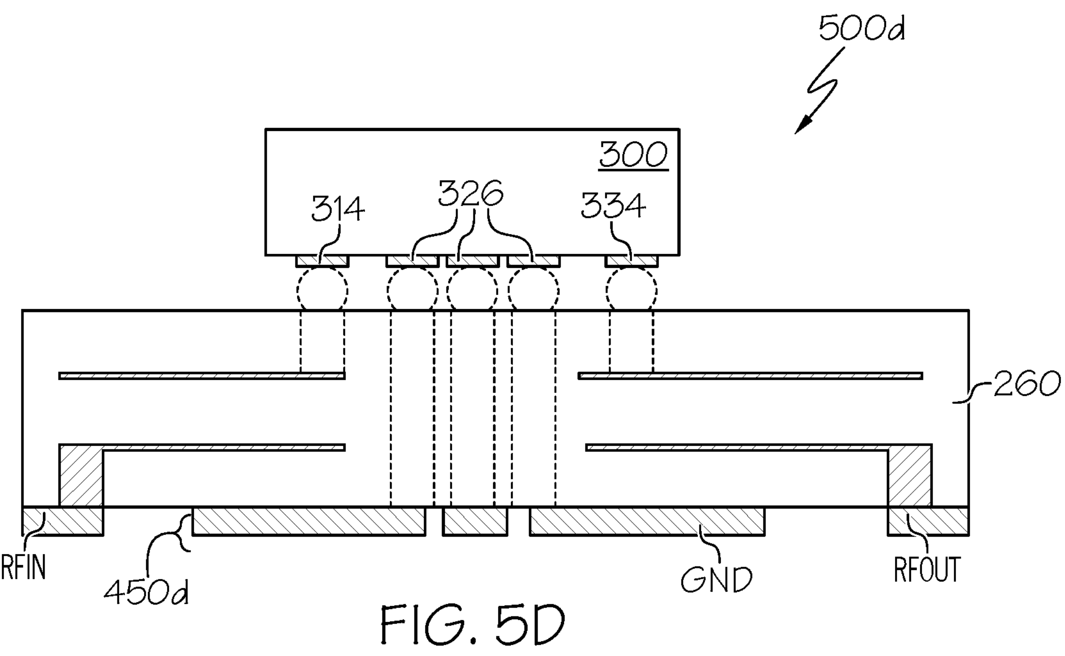
Figure 5E:
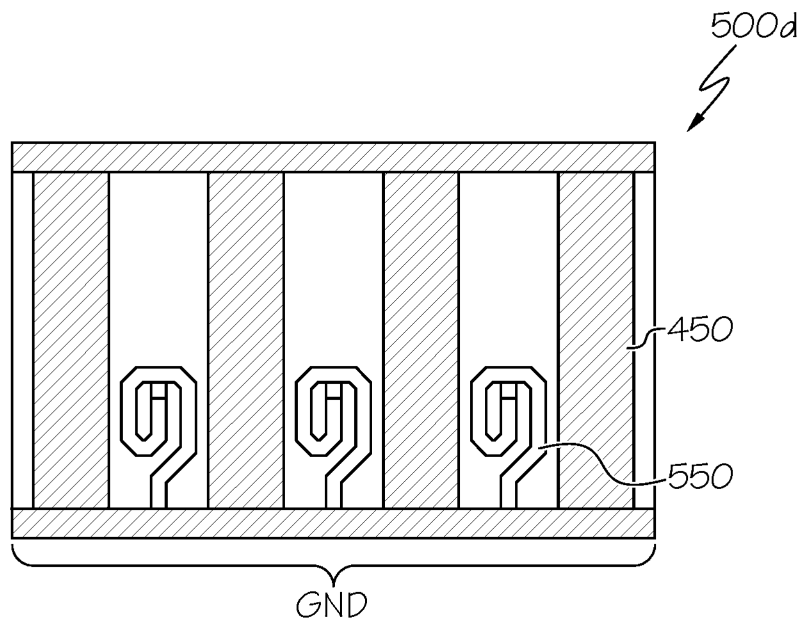
FIG. 5E is a bottom plan view of example transistor amplifier packages including inductance adjustment elements according to some embodiments of the present disclosure.

FIGS. 5A to 5D are side views and FIG. 5E is a bottom plan view of example transistor amplifier packages 500*a* to 500*d* (collectively, 500) including inductance adjustment elements 450 according to some embodiments of the present disclosure. In the examples of FIGS. 5A to 5E, a predetermined inductance may be calculated in order to achieve K≥1 at the desired operating frequency range, and one or more components of the inductance adjustment element 450 may thereby be configured to provide the predetermined inductance.

In particular, FIG. 5A illustrates a package 500*a* in which the inductance adjustment element 450 is implemented by a plurality 450*a* of conductive bumps or pillars 301. For example, based on the size of the transistor die 300, the number of source contact pads 326, and/or the material of the conductive bumps or pillars 301, a number or quantity of conductive bumps or pillars 301 may be selected such that the plurality 450*a* of conductive bumps or pillars 301 collectively provide the calculated inductance (or a portion thereof). In some embodiments, the conductive bumps or pillars 301 may be formed of a solder (e.g., tin) material. In some embodiments, the conductive bumps or pillars 301 may be conductive pillars formed of a copper (Cu) material. The material of the conductive bumps or pillars 301 may provide inductance contributions to the calculated inductance, such that a total number 450*a* of conductive bumps or pillars 301 may provide all or part of the predetermined inductance.

FIG. 5B illustrates a package 500*b* in which the inductance adjustment element 450 is implemented by a dimension 450*b* that provides a distance Dg between the source contacts 326 and the electrical ground member 450*d*. For example, the electrical ground member 450*d* may be provided as an internal layer of (e.g., as an electrical ground reference plane) or on an external surface of (e.g. as a ground terminal GND) of the package substrate 260. In the latter case, a thickness of the package substrate 260 may be configured to implement substantially all of the distance Dg. As such, the distance Dg between the source contacts 326 and the electrical ground member 450*d* may be configured to provide the predetermined inductance (or a portion thereof), alone or in combination with the number 450*a* of conductive bumps or pillars 301.

FIG. 5C illustrates a package 500*c* in which the inductance adjustment element 450 is implemented by the conductive vias 262' of the package substrate 260. In particular, the number, sizes, and/or shapes 450*c* of the conductive vias 262' may be selected to collectively provide the predetermined inductance (or a portion thereof), alone or in combination with the collective inductance provided by the conductive bumps or pillars 301 and/or the distance Dg to the electrical ground member 450*d*.

FIGS. 5D and 5E illustrate a package 500*d* in which the inductance adjustment element 450 is implemented based on patterning 450*d* of the electrical ground member GND. In particular, the electrical ground member GND can be patterned to include one or more inductors 550 that collectively provide the predetermined inductance (or a portion thereof), alone or in combination with the collective inductance provided by the conductive bumps or pillars 301, the distance Dg to the electrical ground member 450*d*, and/or the number/sizes/shapes 450*c* of the conductive vias 262'.

As shown in the example of FIG. 5E, the electrical ground member 450*d* is patterned to provide one or more spiral inductor elements 550. Ground plane patterning **450*d* as shown in FIGS. 5D and 5**E may be particularly useful to provide inductance sufficient to increase the stability factor to be greater than or equal to 1 at lower frequencies (e.g., less than about 500 MHz).

As shown in FIGS. 5A to 5E, each of the components of the inductance adjustment element 450 (the conductive bumps or pillars 301, the distance Dg, the conductive vias 262', and the patterning of the electrical ground member GND) are implemented external to the transistor die 300. In these examples, the die 300 (and the semiconductor structure 310 thereof) is free of internal grounded conductive vias (e.g., the TSVs 28 of FIG. 1B). As such, the inductance adjustment element(s) **450*a*, 450*b*, 450*c*, 450*d* (collectively, 450) may be configured to entirely and precisely provide a predetermined inductance that is sufficient to improve stability by various combinations of external components, without contributions from elements (e.g., through substrate vias) that are internal to the die 300** (and thus, non-changeable).

Figures 6A, 6B:
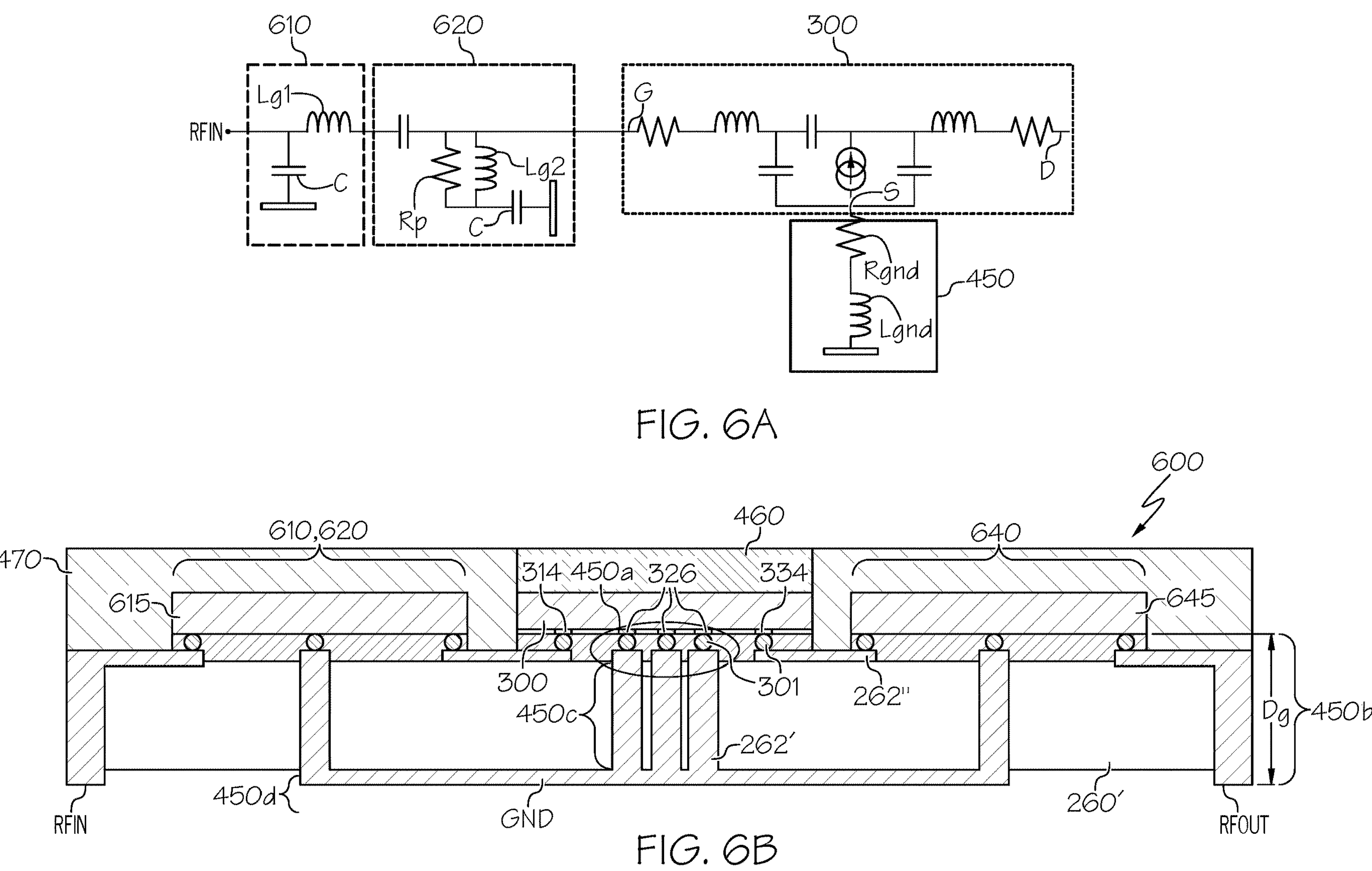
FIG. 6A is a circuit element model and FIG. 6B is a side view illustrating example transistor amplifier packages configured for operation at a desired frequency range with stability factor improvement by impedance matching and inductance adjustment elements according to some embodiments of the present disclosure.

FIG. 6A is a circuit element model and FIG. 6B is a side view illustrating example transistor amplifier packages 600 configured for stability factor improvement with impedance matching, source inductance, and operating frequency adjustment according to some embodiments of the present disclosure.

As shown in the circuit diagram of FIG. 6A, one or more input matching circuits can be implemented by a low pass 610 and high pass 620 matching circuits coupled between the input terminal RFin of the package 600 and the gate terminal 314. The UGW of the gate fingers 16 of the transistor die 300 may be configured for a desired operating frequency range. The impedance adjustment element 450 is configured to provide unconditional stability (i.e., K≥1) for a desired, first operating frequency range. As noted above, the first operating frequency range may be about 4 GHz to about 6 GHz in some embodiments, which may be significantly below the 20 GHz or higher operating frequency range over which some conventional wide bandgap power amplifiers may achieve unconditional stability.

In some embodiments, a high pass impedance matching circuit 620 may be coupled between the input terminal RFin and the gate contact 314. The high pass impedance matching circuit 620 may be configured to provide the stability factor K of greater than or equal to 1 for a second operating frequency range that is higher than the first operating frequency range. For example, the "lossy" configuration of the high pass input impedance matching circuit 620 (shown in FIG. 6B in parallel Rp implementation) may be configured to improve stability (i.e., K≥1) at operating frequencies above about 6 GHz, for example, from about 6 GHz to about 20 GHz.

In some embodiments, a low pass impedance matching network 610 coupled between the input terminal RFin and the gate contact 314, e.g., between the input terminal RFin and the high pass impedance matching circuit 620. The low pass impedance matching network 610 may be configured to provide the stability factor K of greater than or equal to 1 for a third operating frequency range that is lower than the first operating frequency range. For example, the series LC circuit 610 shown in FIG. 6A may be configured to improve stability (i.e., K≥1) at operating frequencies below about 4 GHz, for example, from about 1 GHz to about 4 GHz.

FIG. 6B illustrates an example transistor amplifier package 600 in which a transistor die 300 and one or more passive components 615, 645 (in this example, to provide input matching circuits 610, 620 and output matching circuit 640) are implemented by surface mount components (e.g., SMDs or IPDs) that are also flip chip mounted on a substrate 260' by conductive bumps or pillars 301. The substrate 260' may be a single-layer or multi-layer laminate including conductive vias 262' that are electrically connected to respective terminals 314, 326, 334 of the transistor die 300 by conductive bumps or pillars 301. Passive components of the matching circuits 610, 620, 640 are implemented by surface mount components 615, 645, illustrated as input IPD(s) and output IPD(s). For example, input IPD(s) 615 may be configured to provide matching circuits 610, 620 of coupled to gate terminals 314 of the transistor die 300 conductive bumps or pillars 301. The output IPD(s) 645 may be similarly configured to provide matching circuits 640 (e.g., including a shunt inductance) that is coupled to a drain terminal 334 of a respective transistor die 300 by conductive bumps or pillars 301.

The source terminals 326 of the a respective transistor die 300 may be coupled to a ground terminal GND of the package 600 by conductive bumps or pillars 301 and conductive vias 262' extending through the package substrate 260'. The plurality **450*a* of bumps/pillars 301, the distance Dg 450*b* between the source contacts 326 and the ground terminal GND, the plurality 450*c* of conductive vias 262', and/or the patterning 450*d* of the electrical ground member GND may be configured to provide a predetermined inductance such that the stability factor K is greater than or equal to 1 for a desired operating frequency range. Moreover, the low pass impedance matching circuit 610 and the lossy high pass impedance matching circuit 620, which are coupled between the input terminal RFin and the gate contact 314**, are configured to provide the stability factor K of greater than or equal to 1 for operating frequency ranges that are lower than and higher than the desired operating frequency range, respectively.

While illustrated with reference to surface mount devices 615, 645 such as IPDs, it will be understood that one or more components of the input matching circuits 610, 620 (and/or the output matching circuit 640 may be implemented by distributed element structures within the layers of the substrate 260' in some embodiments. For example, the conductive connection patterns 262 and related structures in the multi-layer laminate 260' may electrically couple and/or may implement passive electrical components of one or more of impedance matching circuits 610, 620, 640. Other electrical components may also be implemented by the conductive connection patterns 262 in or on the substrate 260, 260'.

As such, respective input impedance matching circuits 610, 620 may be coupled to respective input terminals (e.g., gate pads or terminals 314) of one or more transistor dies 300. Respective output terminals (e.g., drain pads or terminals 334) of the one or more transistor dies 300 are coupled to respective output impedance matching circuits 640. A transistor amplifier package 400, 500, 600 may thus include the semiconductor structure 10, 310 of the one or more transistor dies 300 as well the impedance matching circuits phase delay elements, and/or other circuit components that may be used to define a power amplifier 400, 500, 600.

The transistor amplifier packages 400, 500, and 600 of FIGS. 4B, 5A to 5D, and 6B may each include the semiconductor structure 10, 310 (including the first and second transistor amplifiers 300 and 230) and/or matching circuits 610, 620, 640 sealed or otherwise protected in a package housing or other protective member 470. For example, the protective member 470 may include a lid member (e.g., a ceramic-based lid) that defines an open cavity around the package components (see FIG. 4B), or an overmold member (e.g., a polymer-based encapsulant) that encapsulates the package components (see FIG. 6B). In some embodiments, the lid member may be a thermally conductive material for dissipating or otherwise transmitting heat outside of the packages 400, 500, 600. The example transistor amplifier packages 400, 500, 600 may also include a heat dissipating member 465 having a surface that is exposed by or in contact with the protective member 470.

In FIGS. 4B, 5A to 5D, and 6B, the semiconductor structure 10, 310 (including the transistor amplifiers 300, 230) is flip chip mounted on the substrate 260', 260". The gate, source, and drain terminals 314, 326, and 334 are provided on one surface of the semiconductor structure 10, 310, which is mounted face-down on the substrate 260', 260" such that the terminals 314, 326, 334 are coupled to conductive connection patterns 262 by conductive bumps or pillars 301. RF input leads RFin and RF output leads RFout are provided on surfaces of the substrate 260', 260" for attachment and/or coupling to external devices, such as a customer circuit board. While illustrated in the figures as being provided on an opposite surface of the substrate 260', 260" than the semiconductor structure 10, 310, it will be understood that transistor amplifier packages as described herein are not limited to such an arrangement, and the RF input leads RFin and RF output leads RFout may be provided on the same surface of the substrate 260', 260" as the semiconductor structure 10, 310 in some embodiments.

Figure 7A:
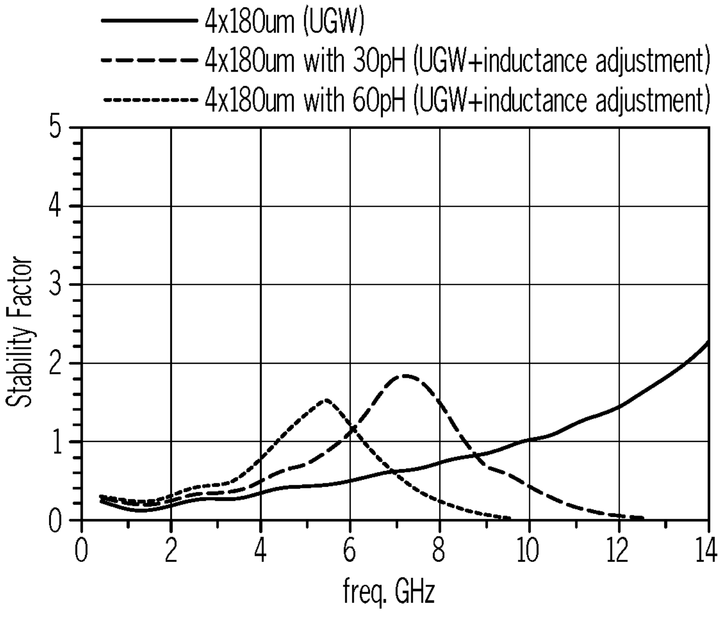
FIGS. 7A, 7B, 7C, and 7D are graphs illustrating stabilization effects of inductance adjustment elements according to some embodiments of the present disclosure.

FIGS. 7A to 7D are graphs illustrating stabilization effects that may be achieved by inductance adjustment elements in accordance with some embodiments of the present disclosure. As shown in FIG. 7A, transistor amplifier packages including inductance adjustment elements electrically coupled between the output (e.g., the source terminal or contacts) of a transistor die and an electrical ground member (e.g., a package substrate ground plane) according to embodiments of the present disclosure may provide a stability factor K of greater than or equal to 1 over a desired operating frequency range, in this example, between about 6 GHz to about 8.5 GHz, or between about 4 GHz to about 6 GHz. In particular, FIGS. 7A to 7D illustrate the effects of gate fingers of the transistor die having a UGW configured based on a desired operating frequency range (i) without inductance adjustment elements as described herein, (ii) with an inductance adjustment element configured to provide an inductance of about 30 picohenrys (pH); and (iii) with an inductance adjustment element configured to provide an inductance of about 60 pH.

Figure 7B:
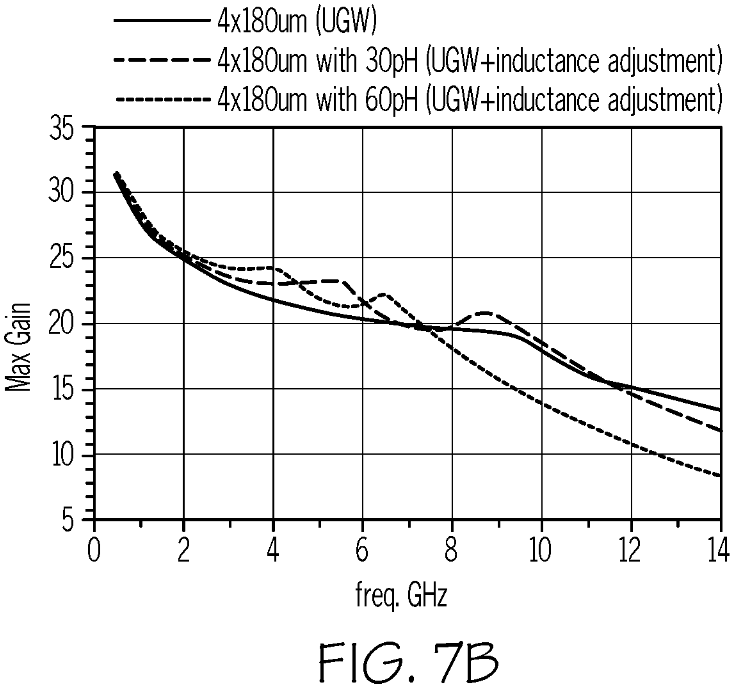
Figure 7C:
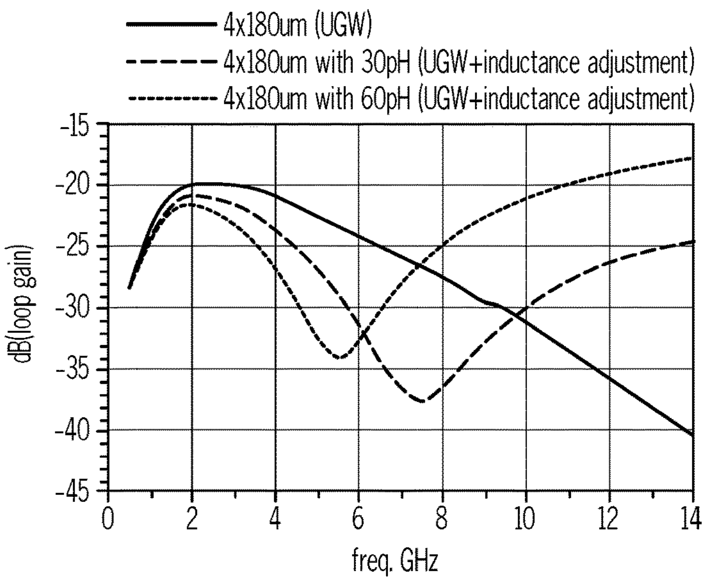
Figure 7D:
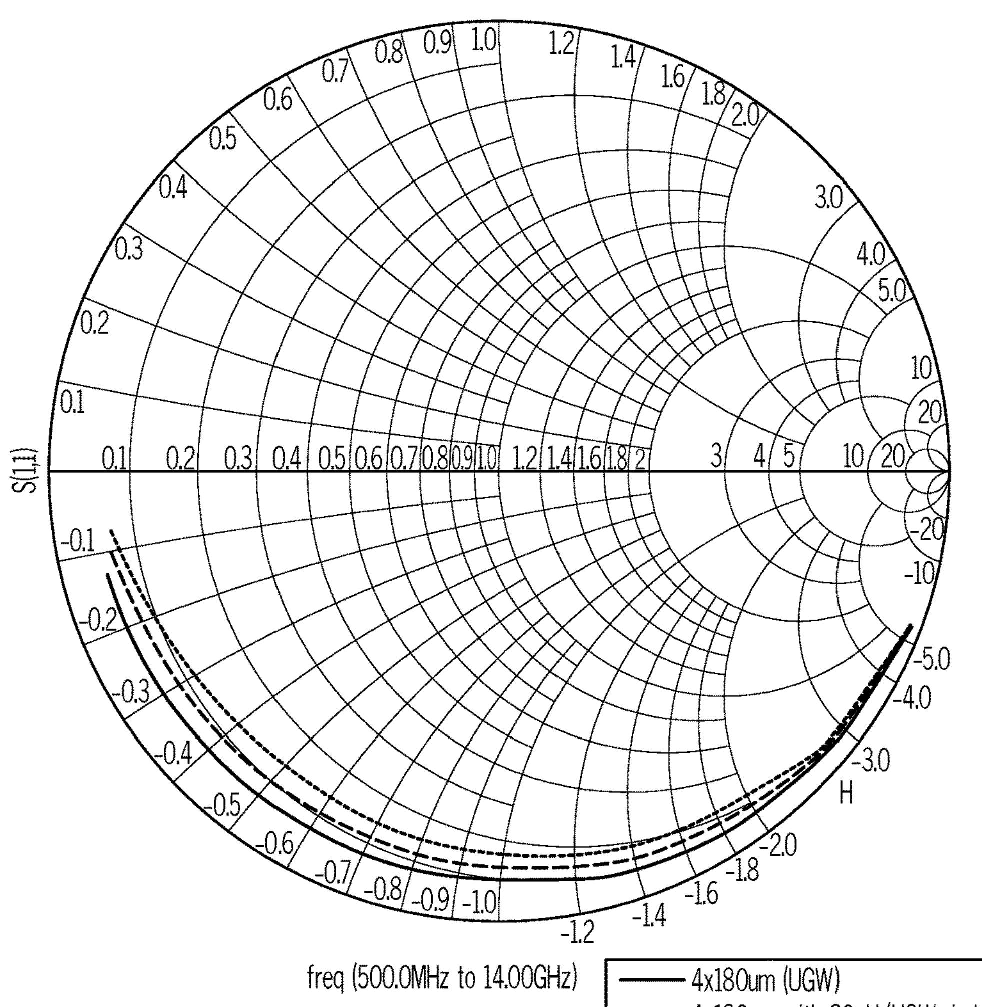

As shown in FIG. 7A, a transistor die having a source terminal directly coupled to the electrical ground member (i.e., without the use of inductance adjustment elements 450 as described herein) may provide unconditional stability ($K \geq 1$) at frequencies of greater than about 10 GHz. Providing an inductance adjustment configured to provide an inductance of about 30 pH may achieve unconditional stability ($K \geq 1$) at a lower frequency range, i.e., between about 6 GHz to 8.5 GHz. Further increasing the inductance provided by the inductance adjustment element to about 60 pH may achieve unconditional stability ($K \geq 1$) at a lower frequency range, i.e., between about 4 GHz to 6 GHz. That is, increasing the inductance provided by inductance adjustment elements as described herein may shift the stability factor K to be greater than or equal to 1 at lower frequency ranges. FIGS. 7B, 7C, and 7D illustrate corresponding effects of increasing the inductance provided by inductance adjustment elements as described herein on maximum gain, loop gain, and S-parameters, respectively.

As shown in FIGS. 7A to 7D, inductance adjustment elements in accordance with embodiments described herein can allow for tuning of the stability factor K in a broad manner, and thus, may be used to improve RF stability (e.g., by increasing K to be greater than or equal to 1) at a desired operating frequency range. It should be noted that the inductance adjustment elements coupled between the source terminal and the electrical ground member may not substantially affect stability at comparatively lower or higher frequencies than the desired or designed operating frequency range. However, as shown by the circuits 610 and 620 in the embodiments of FIGS. 6A and 6B, the inclusion of a low pass-input matching circuit and a (lossy) high pass input matching circuit may be used to address these shortcomings and thereby provide a stability factor K of greater than or equal to 1 at operating frequency ranges lower than and higher than the desired operating frequency range, respectively.

Accordingly, embodiments of the present disclosure may thus provide flip chip device stability by (i) providing a transistor die 300 having gate fingers 16 with a UGW based on the RF operating frequency range of interest; (ii) configuring the ground source inductance using one or more inductance adjustment elements 450 as described herein; and (iii) providing a lossy high pass 620 and low pass 610 input matching network to improve stability above and/or below the RF operating frequency range of interest.

As described herein, embodiments of the present disclosure provide transistor structures and a matching topology configured using conductive bumps/pillars and/or flip chip arrangements (which may include flip chip mounting of the transistor amplifiers, the passive components of the matching circuits, or both), which can reduce or eliminate the use of through semiconductor vias, wirebonds, and/or wirebond pads. Some embodiments described herein may be used in combination with output matching circuits including a shunt inductance directly in the drain plane of a transistor amplifier, that is, directly coupled to the drain terminal of the transistor amplifier by one or more conductive bumps/pillars, as described for example in European Patent Application No. 22305921.3, the disclosure of which is incorporated by reference herein. Some embodiments may also include one or more thermal/heat dissipation paths (e.g., at the "top" side (which is opposite the gate, drain, and source terminals in a flip chip configuration) and/or the "bottom" side (which, includes the gate, drain, and source terminals in a flip chip configuration) thereby improving thermal performance.

Embodiments of the present disclosure may be used in various cellular infrastructure (CIFR) RF power products (including, but not limited to 5 W, 10 W, 20 W, 40 W, 60 W, 80 W and different frequency bands) e.g., for 5G and base station applications, as well as for radar and monolithic microwave integrated circuit (MMIC)-type applications. More generally, any RF PA may be used in conjunction with and may benefit from embodiments of the present disclosure.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A radio frequency (RF) transistor amplifier package, comprising:

a transistor die comprising a semiconductor structure including a plurality of transistors and gate, drain, and source contacts electrically coupled thereto; and an inductance adjustment element that is electrically coupled between the source contacts and an electrical ground member, and is configured to provide a stability factor K of greater than or equal to 1 for a first operating frequency range of the transistor die, wherein the first operating frequency range comprises at least about 4 GHz to about 6 GHz.

2. The RF transistor amplifier package of claim 1, further comprising:

a package substrate comprising input, output, and ground terminals, wherein the transistor die is on the package substrate and the ground terminal is electrically coupled to the electrical ground member.

3. The RF transistor amplifier package of claim 2, wherein the transistor die is mounted on a surface of the package substrate in a flip chip configuration with the source contacts adjacent the surface of the package substrate.

4. The RF transistor amplifier package of claim 2, wherein the inductance adjustment element is configured to provide a predetermined inductance and is external to the transistor die.

5. The RF transistor amplifier package of claim 4, wherein the inductance adjustment element comprises at least one of:

a plurality of conductive bumps or pillars;

a dimension that is configured to separate the source contacts and the ground terminal;

one or more conductive connection patterns in the package substrate; or a patterning of the electrical ground member.

6. The RF transistor amplifier package of claim 4, wherein the predetermined inductance is free of inductance contributions from conductive vias that extend in the semiconductor structure of the transistor die.

7. The RF transistor amplifier package of claim 4, wherein the transistor die comprises a plurality of source fingers on the semiconductor structure, and is free of conductive vias that are electrically coupled to the source fingers.

8. The RF transistor amplifier package of claim 7, wherein the inductance adjustment element is configured to provide an entirety of the predetermined inductance.

9. The RF transistor amplifier package of claim 4, further comprising:

a first impedance matching circuit that is electrically coupled between the input terminal and the gate contact, and is configured to provide the stability factor K of greater than or equal to 1 for a second operating frequency range that is higher than the first operating frequency range.

10. The RF transistor amplifier package of claim 4, further comprising:

a second impedance matching circuit that is electrically coupled between the input terminal and the gate contact, and is configured to provide the stability factor K of greater than or equal to 1 for a third operating frequency range that is lower than the first operating frequency range.

11. The RF transistor amplifier package of claim 1, wherein the transistor die comprises a plurality of gate fingers on the semiconductor structure, and wherein a respective gate finger of the plurality of gate fingers has a unit gate width (UGW), and wherein the UGW is configured based on the first operating frequency range.

12. The RF transistor amplifier package of claim 1, wherein the semiconductor structure comprises gallium nitride and/or silicon carbide.

13. A method of fabricating a radio frequency (RF) transistor amplifier package, the method comprising:

providing a transistor die comprising a semiconductor structure including a plurality of transistors and gate, drain, and source contacts electrically coupled thereto; and providing an inductance adjustment element that is electrically coupled between the source contacts and an electrical ground member, and is configured to provide a stability factor K of greater than or equal to 1 for a first operating frequency range of the transistor die, wherein the first operating frequency range comprises at least about 4 GHz to about 6 GHz.

14. The method of claim 13, further comprising:

providing the transistor die on a package substrate comprising input, output, and ground terminals, wherein the ground terminal is electrically coupled to the electrical ground member.

15. The method of claim 14, further comprising:

mounting the transistor die on a surface of the package substrate in a flip chip configuration with the source contacts adjacent the surface of the package substrate.

16. The method of claim 14, wherein the inductance adjustment element is configured to provide a predetermined inductance and is external to the transistor die.

17. The method of claim 16, wherein providing the inductance adjustment element comprises at least one of:

providing a plurality of conductive bumps or pillars;

providing a dimension that is configured to separate the source contacts and the ground terminal;

providing one or more conductive connection patterns in the package substrate; or providing a patterning of the electrical ground member.

18. The method of claim 16, wherein the predetermined inductance is free of inductance contributions from conductive vias that extend in the semiconductor structure of the transistor die.

19. The method of claim 16, wherein the transistor die comprises a plurality of source fingers on the semiconductor structure, and is free of conductive vias that are electrically coupled to the source fingers.

20. The method of claim 16, wherein the inductance adjustment element is configured to provide an entirety of the predetermined inductance.

21. The method of claim 16, further comprising:

providing a first impedance matching circuit that is electrically coupled between the input terminal and the gate contact, and is configured to provide the stability factor K of greater than or equal to 1 for a second operating frequency range that is higher than the first operating frequency range.

22. The method of claim 16, further comprising:

providing a second impedance matching circuit that is electrically coupled between the input terminal and the gate contact, and is configured to provide the stability factor K of greater than or equal to 1 for a third operating frequency range that is lower than the first operating frequency range.

23. The method of claim 13, wherein providing the transistor die comprises:

forming a plurality of gate fingers on the semiconductor structure, wherein a respective gate finger of the plurality of gate fingers has a unit gate width (UGW), and wherein the UGW is configured that is based on the first operating frequency range.

24. The method of claim 13, wherein the semiconductor structure comprises gallium nitride and/or silicon carbide.

25. A radio frequency (RF) transistor amplifier package, comprising:

a transistor die comprising a semiconductor structure including a plurality of transistors and gate, drain, and source contacts electrically coupled thereto, wherein the transistor die is configured to provide a stability factor K of less than 1 for a first operating frequency range; and an inductance adjustment element that is external to the transistor die and is electrically coupled between the source contacts and an electrical ground member, wherein the inductance adjustment element provides a predetermined inductance that is configured to increase the stability factor K to be greater than or equal to 1 for the first operating frequency range, and the predetermined inductance is free of inductance contributions from conductive vias that extend in the semiconductor structure of the transistor die.

* * * * *